United States Patent
Pivit et al.

(10) Patent No.: US 7,151,422 B2
(45) Date of Patent: Dec. 19, 2006

(54) 90° HYBRID

(75) Inventors: Erich Pivit, Allmersbach In Tal (DE);
Michael Glück, Freiburg (DE);
Christian Fritsch, Waldkirch (DE)

(73) Assignee: Huettinger Elektronik GmbH + Co. KG, Freiburg (DE)

( * ) Notice: Subject to any disclaimer, the term of this patent is extended or adjusted under 35 U.S.C. 154(b) by 0 days.

(21) Appl. No.: 11/374,387

(22) Filed: Mar. 13, 2006

(65) Prior Publication Data

US 2006/0208827 A1    Sep. 21, 2006

Related U.S. Application Data

(63) Continuation of application No. PCT/EP2004/010127, filed on Sep. 10, 2004.

(30) Foreign Application Priority Data

Sep. 12, 2003  (DE) ............... 103 42 611

(51) Int. Cl.
*H01P 5/12* (2006.01)
*H01P 5/04* (2006.01)
*H01P 5/18* (2006.01)

(52) U.S. Cl. .............. 333/117; 333/24 R; 333/111
(58) Field of Classification Search ........ 333/117, 333/118, 119, 24 R, 26, 109, 111, 112, 116
See application file for complete search history.

(56) References Cited

U.S. PATENT DOCUMENTS

| | | | |
|---|---|---|---|
| 3,629,733 A | 12/1971 | Podell | 333/116 |
| 4,701,716 A | 10/1987 | Poole | 330/43 |
| 4,817,189 A * | 3/1989 | Pfizenmaier et al. | 375/258 |
| 4,980,654 A * | 12/1990 | Moulton | 333/12 |
| 5,138,287 A * | 8/1992 | Domokos et al. | 333/12 |
| 5,705,971 A * | 1/1998 | Skibinski | 336/82 |
| 6,066,994 A | 5/2000 | Shepherd et al. | 333/109 |

FOREIGN PATENT DOCUMENTS

| | | |
|---|---|---|
| DE | 4407788 | 9/1995 |
| DE | 19749912 | 12/1998 |
| FR | 1 447 091 | 6/1966 |
| GB | 896707 | 5/1962 |
| JP | 04-104603 | 4/1992 |

* cited by examiner

*Primary Examiner*—Dean Takaoka
(74) *Attorney, Agent, or Firm*—Fish & Richardson P.C.

(57) ABSTRACT

A 90° hybrid for splitting or interconnecting radio frequency power includes four gate connections, capacitances and inductances for electric capacitive coupling and magnetic inductive coupling, an arrangement of strip conductors that are disposed approximately parallel to each other and whose ends form gate connections, and whose dimensions and mutual separations are dimensioned to form the electric capacitive and magnetic inductive couplings of the 90° hybrid, and a ferrite ring surrounding the strip conductors to increase the inductive coupling.

39 Claims, 5 Drawing Sheets

90° HYBRID

CROSS REFERENCE TO RELATED APPLICATION

This application is a continuation of, and claims priority under 35 U.S.C. §120 to PCT/EP2004/010127, filed on Sep. 10, 2004, and designating the U.S., and claims priority under 35 U.S.C. §119 from German application DE 103 42 611.6, filed Sep. 12, 2003. Both of these priority applications are hereby incorporated by reference in their entirety.

TECHNICAL FIELD

The application relates to a 90° hybrid for splitting or combining radio-frequency power.

BACKGROUND

Radio-frequency (RF) amplifiers with the common industrial frequencies of 13.56 MHz and 27.12 MHz and output powers of 1 kW to 50 kW are conventionally used in the field of laser excitation or plasma processes.

Load impedances of laser excitation or plasma processes can be non-linear and dynamic, exhibiting unpredictable changes. These dynamic impedance changes generate reflections that produce losses in the RF amplifier. Large reactive energies that are stored in the reactive elements of the RF amplifiers, in the feed lines, and in reactive elements of matching networks can thereby be discharged. Such discharge may generate high voltages or currents, may excite oscillations in the RF amplifier, or may destroy components of the RF amplifier. Such load impedance changes may occur, for example, during striking of the laser excitation or plasma processes, or during arcing in the plasma process.

Radio-frequency operated laser excitations, and, to an increasing extent, also radio-frequency excited plasma processes, can be operated in a pulsed manner, i.e., the radio frequency amplifiers are switched on and off with pulse frequencies of, e.g., 100 Hz to 300 kHz, or are switched between two power ranges. Temporary reflections may be produced during each switching process, and these temporary reflections may be converted into lost energy, that may accumulate as excess heat in the RF amplifiers.

The output stages of such RF amplifiers may be realized with transistors for small powers (for example, 1–6 kW). For larger power, tubes may be used as output stages of RF amplifiers. Tubes can be more robust to reflections and can discharge lost energy more effectively than transistors. Tubes, however, can be more expensive than transistors, can be subjected to wear during operation, and can be relatively large. Tube RF amplifiers can be bundled together with a drive circuit and cooling system in switching cabinets of a size of approximately 0.8 m×1 m×2 m.

RF amplifiers of a greater power may be formed with transistor output stages. The use of transistorized amplifiers has increased the use of switched amplifiers that operate in resonance mode. The transistors are thereby switched to produce a minimum or low amount of lost energy. In this manner, it is possible to construct amplifiers having very small dimensions and a comparatively large power. It is possible to construct 13.56 MHz 3 kW amplifiers of a size of approximately 0.3 m×0.2 m×0.2 m. Integration of these amplifiers in plasma systems or into laser excitation arrangements is facilitated due to their size.

Transistorized output stages can produce great power by interconnecting several synchronously operating RF amplifiers. The RF amplifiers are interconnected using so-called combiners. There are different types of construction of these combiners.

EP0962048B1 discloses, e.g., interconnection of several radio-frequency power amplifiers that is realized by so-called transmission-line combiners.

EP0731559 describes the interconnection of two RF amplifiers by way of a 0° combiner, in which the input signal of an amplifier is phase-shifted, and the output signal of the same amplifier is also shifted, so that the phases at the input of the combiner are again in phase. Cables of defined length are proposed as phase shifters. The cables are approximately 4 m long for 13.56 MHz using a conventional cable with a phase speed of $0.69 \ast c_0$ (where $c_0$=speed of light in vacuum).

The so-called 90° hybrid is a combiner that is frequently used in microwave technology or in radio transmission technology. The 90° hybrid is also called a 3 dB coupler. The 90° hybrid includes a quadruple gate or four-port device, i.e., it has four gates or ports.

When the 90° hybrid is used as combiner, two RF power amplifiers having identical inner resistances, identical output frequencies, and output signals that are phase-shifted by 90° are connected to one gate each. A load with a load resistance is connected to a third gate. A load compensating resistance is connected to the fourth gate.

The load resistance, load compensating resistance, and inner resistances of the amplifiers are the same. The exclusively passive components of the 90° hybrid (lines, capacitances, transmitters, or inductances) are designed in such a manner that the power of the two amplifiers is combined at the load, no power is dissipated at the load compensating resistance, and the two amplifiers are decoupled and cannot influence each other. The 90° hybrid itself is loss-free in the ideal case, i.e., the whole power of the two RF amplifiers is supplied to the load applied to the third gate.

DE 1143873 (GB0966629) discloses an application for combining the outputs of two load amplifiers for a short-wave transmitter. The coupler includes four lines of line sections of a length of $\lambda/4$, and a shorter construction consisting of $\lambda/8$ lines with additional capacitors, where $\lambda$ is the wavelength of the transmitted medium frequency. For example, $\lambda$ is 15.27 m for a medium frequency of 13.56 MHz with a common cable having a phase speed of $0.69 \ast c_0$ (where $c_0$=light speed in vacuum). In this example, $\lambda/8$ is almost 2 m, which is rather large for conventional amplifier sizes.

SUMMARY

Discussed in more detail below is a 90° hybrid that interconnects or splits radio-frequency (RF) power, is designed as a quadruple gate or four-port device having four gate connections or ports, and includes capacitances and inductances for electric capacitive coupling and magnetic inductive coupling. The dimensions of the 90° hybrid should be smaller than one eighth of the wavelength $\lambda$ of the basic RF frequency. The construction should also be simple and inexpensive to manufacture.

Finally, it should be possible to easily operate loads with changing load resistance such as, for example, laser or plasma excitation and the use of radio-frequency power amplifiers with transistor output stages should also be possible.

In one general aspect, a 90° hybrid includes at least one first and at least one second electric conductor that are spaced apart from each other and are capacitively and inductively coupled to each other in a coupling region. The 90° hybrid includes at least one inductance increasing element in the coupling region to increase the inductance of the conductors. This design considerably reduces the dimensions of the 90° hybrid for frequencies below 50 MHz. The electric conductors may be smaller than λ/4, smaller than λ/8, or smaller than λ/10. The coupling between the electric conductors corresponds to capacitive coupling and inductive coupling between the conductors. The capacitive coupling depends on the surface and separation of the conductors, and the inductive coupling depends on the length of the conductors and on the additional inductance-increasing elements. The inductance-increasing element may have any shape. It may surround at least part of the conductors in the coupling region. It may be disposed, e.g., parallel to the conductors, which would provide a particularly simple and effective coupling. In one implementation, the inductance-increasing element surrounds the conductors in the coupling region like a ring such that the strip conductors are surrounded by an enclosed geometry that may be circular, ellipsoidal, rectangular, etc. The ring-shaped geometry advantageously reduces stray fields. A rectangular structure of the ring facilitates the discharge of heat that is generated in the inductance-increasing element, to a planar cooling plate.

The rectangular structure may include several parts, e.g., of four cuboids or of two U-shaped parts or of one U-shaped part and one cuboid. The constructions that are composed of several parts facilitate production and it is moreover possible to provide adjustable gaps between the parts to adjust the inductance.

The electric capacitive coupling and also the magnetic inductive coupling of a 90° hybrid is formed by an arrangement of strip conductors that are disposed approximately parallel to each other, and whose ends form gate connections and whose sizes and mutual separations are dimensioned such as to form the electric capacitive and magnetic inductive couplings required for the 90° hybrid, and a ferrite ring surrounding the strip conductors is provided to increase the inductive coupling.

With this action, the coupling capacitance and the coupling inductance can be produced with simple production means and yet sufficient accuracy.

In another general aspect, the 90° hybrid includes at least two strip conductors. No further passive or active components of discrete form are needed. In a further aspect, the 90° hybrid includes an inductance increasing element, in particular, a ferrite ring surrounding the strip conductors. The at least two strip conductors form both the inductances and the capacitances due to their geometric dimensions and arrangement relative to each other. This simple construction facilitates production, thereby especially also permitting a reproducible arrangement since the predetermined values for the electric capacitive coupling and magnetic inductive coupling depend on the dimensions and the position of the strip conductors.

In one general aspect, the 90° hybrid includes a first connection for a first radio-frequency amplifier, a second connection for a second radio-frequency amplifier, a third connection for a load with a load resistance and a fourth connection for a load compensating resistance. In a further general aspect, the 90° hybrid includes an inductive transmitter, one coupling inductance of which is connected to the first connection and also to the fourth connection, and whose other coupling inductance is connected in parallel to an inductance and also to the third connection as well as to the second connection. Coupling capacitances are provided each between the first and the third and the fourth and the second connection.

The inductance is substantially determined by the strip conductor length between the third connection for the load and the second connection for the second radio-frequency amplifier. The magnetic inductive coupling is substantially determined by the separation between the neighboring strip conductors, and the capacitances are substantially determined by the surface of the opposite strip conductors and their mutual separations in a ratio of 1:1.

This design realizes good inductive coupling and at the same time sufficient capacitance. Additional discrete components for the coupling capacitances are not required. Merely inductance-increasing elements, in particular, a ferrite ring surrounding the strip conductors, are provided to increase the inductive coupling.

Production of the inductive transmitter uses tight inductive coupling, i.e., the primary and secondary lines are as close to each other as possible.

In one implementation, flat spacers or insulators, preferably of an insulating material with an $\in_r$ of approximately 2.33 (or of 2 to 2.6) and a thickness of approximately 0.5 mm to 3 mm may be provided between the neighboring strip conductors.

Polytetrafluoroethylene (PTFE) may be used as an insulating material of the spacers or insulators to obtain a high quality and a high dielectric strength. PTFE is also known under the trade name "Teflon".

The spacers or insulators provide a defined and primarily constant separation between the strip conductors in a very simple manner.

The insulators provided between neighboring strip conductors advantageously feature an excess length over the strip conductor contour, preferably by approximately 0.5 mm to approximately 3 mm. This ensures a safe air gap and creepage distance between the strip conductors.

In accordance with one implementation, each of the strip conductors may be laminated, printed, or coated onto a carrier layer of insulating material, and several such arrangements may be stacked on top of each other.

As mentioned above, this ensures a defined constant separation between the strip conductors. The strip conductors having a carrier layer as dielectric may be easily realized using a board draft and printed circuit production.

Stacking may cause capacitance inaccuracies caused by air gaps. This disadvantage can be circumvented by printing, coating, or laminating both sides of the carrier layer, defining the separation between these two strip conductors on the carrier layer. If several of these carrier layers that are coated on both sides, are stacked, two coatings of two stacked carrier layers are always more or less in contact with each other. The contact need not be that good, since the contacting layers are at the same potential and air gaps have no disturbing effect any more in this arrangement.

To reduce the size of the 90° hybrid, at least one ferrite ring that preferably surrounds the strip conductors, and preferably has an $A_L$ value of between approximately 40 nH and 200 nH, or a similar inductance-increasing element may be provided to increase the inductance, where the $A_L$ value is the inductivity in a coil having a winding of n=1 and its value depends on the material of the coil.

Depending on the power to be coupled, it is possible to use ferrite rings with relatively high or low magnetic loss. It is possible to use ferrite rings with relatively high magnetic loss for comparably small powers, and ferrite rings having a low magnetic loss for larger powers. Identically-sized ferrite bodies with low magnetic loss generally have smaller $A_L$ values. For this reason, a correspondingly larger number of ferrite bodies are used to obtain the same inductance.

While ferrite rings with a large $A_L$ value of, e.g., 200 nH can be used for comparably small powers, requiring only a small number of ferrite rings to obtain the required inductance of, e.g., 500 nH, it is necessary to use ferrite rings of a smaller $A_L$ value for high powers (e.g., 5 kW) with correspondingly large currents in the strip conductors to prevent correspondingly high ferromagnetic losses in the ferrite cores. The magnetic or gyromagnetic losses in the ferrite core increase depending on the material at certain frequencies up to a magnetic resonance frequency. If this ferromagnetic resonance frequency is too low and too close to the operating frequency, the losses will heat the ferrite.

For this reason, a correspondingly larger number of ferrite rings having a smaller $A_L$ value may be used for high powers.

The 90° hybrid may be designed with a basic surface of 7 cm×20 cm or smaller at a power of up to 10 kW and an operating frequency of 13.56 MHz.

Furthermore, in another implementation, the 90° hybrid may be designed with a basic surface of 10 cm×15 cm or smaller for a power of up to 50 kW and an operating frequency of 13.56 MHz.

In both cases, the height is approximately 10 cm or less. The operating frequency is not limited to 13.56 MHz but may be in the range between 1 and 100 MHz. The 90° hybrid can also be used for considerably lower frequencies, since the strip conductors do not function as line couplers but as coupling capacitances and coupling inductances. If the strip conductors operated as power couplers, at least one line length of λ/4 would be utilized. Special constructions might permit even a line length of λ/8. Unlike in prior line couplers, the design size of the 90° hybrid need not be extended if the frequency is reduced. Rather, the capacitance and inductance values can be adjusted accordingly.

More than two strip conductors, i.e., an integer multiple of the two strip conductors, may be disposed with facing flat sides, to increase the capacitances.

A strip conductor packet may be formed of at least four strip conductors, in which two strip conductors that do not directly border each other are each electrically connected at their ends, forming gate connections at the respectively connected ends.

The strip conductors that are connected to each other at their ends advantageously have laterally offset connecting tags at their connecting ends, and directly neighboring strip conductors have connecting tags at the same sides, which are laterally offset in opposite directions.

This facilitates mounting of the radio-frequency connections (gate connections). When boards with strip conductors are used, the electric connections of the strip conductors that are disposed not directly next to each other, can be realized through simple through-contacts, as are known from printed circuit board technology. Each connecting point preferably has several such through-contacts to reduce the transition resistance.

The 90° hybrid can be used for plasma or laser excitation, in particular, for coupling transistorized power amplifiers.

The different load states that occur in connection with plasma or laser excitation can produce reflections and oscillations, which can be dangerous for the output stages of the amplifiers used for this purpose.

The 90° hybrid can have varying constructions and can be used for the varying applications.

In one implementation, the 90° hybrid is used for interconnecting transistorized power amplifiers for plasma or laser excitation.

During ideal operation of the 90° hybrid, the load resistance, the inner resistances of the amplifiers, and the load compensating resistance are the same, assuming that the load has a static value. In practice however, ideal loads are rare. For example, in feeding plasma processes, the "visible" load may be a large problem for the amplifier. Non-striked plasma has a completely different load than in the striked state. Although this problem is reduced by complex matching systems, it is not possible to always provide an ideal amplifier load. Reflections are thereby produced. These reflections are returned and distributed to the amplifiers with the result that the full reflection appears proportionally at the input gates.

The inner resistance of an amplifier normally has a high reactive portion. For this reason, an amplifier has a reflection factor. If the amplifiers to be combined have the same construction, their reflection factors are also the same. The voltage reflected by the load is therefore re-reflected by the amplifier. Due to phase rotation upon reflections, the reflected power is not transferred to the load at the third gate but to the load compensating resistance at the fourth gate. If the latter is terminated by an ideal absorber resistance R, the power reflected by the load is dissipated in the absorbing resistance and is not reflected again. This is one of the advantages of the combination of two amplifiers through the 90° hybrid.

The 90° hybrid thereby forms a protection circuit that prevents destruction of the connected radio-frequency amplifiers in case reflections are produced by different load states, thereby permitting safe operation of transistorized output stages also in such applications.

In one general aspect, a 90° hybrid for splitting or interconnecting radio frequency power includes four gate connections, capacitances and inductances for electric capacitive coupling and magnetic inductive coupling, an arrangement of strip conductors, and a ferrite ring surrounding the strip conductors to increase the inductive coupling. The strip conductors are disposed approximately parallel to each other and have ends that form gate connections, and have dimensions and mutual separations that are dimensioned to form the electric capacitive and magnetic inductive couplings of the 90° hybrid.

Implementations may include one or more of the following features. For example, the core of the ferrite ring may have an AL value of between approximately 40 nH and 200 nH. The arrangement of the strip conductors may include greater than two strip conductors that are disposed with their flat sides facing each other, to increase the coupling capacitances.

The arrangement of the strip conductors may include a strip conductor packet that is formed of at least four strip conductors, such that the ends of two not directly neighboring strip conductors are in each case electrically connected, forming gate connections at the respectively connected ends. The strip conductors that are connected at their ends may have laterally offset connecting tags at their connecting ends, and directly neighboring strip conductors may have connecting tags on the same sides that are laterally offset in opposite directions.

The arrangement of the strip conductors may include flat insulators provided between neighboring strip conductors. The flat insulators located between the neighboring strip conductors may project past the strip conductor outline by preferably approximately 0.5 mm to approximately 3 mm.

The flat insulators may be made of an insulating material having an $\in_r$ of approximately 2 to 2.6, and a thickness of approximately 0.5 mm to 3 mm.

The arrangement of strip conductors may include a combination structure including an insulating material and a lamination, printing, or coating of each of the strip conductors onto a carrier layer of the insulating material. The arrangement of the strip conductors may include several combination structures stacked on top of each other. The combination structure may include a strip conductor packet having more than two strip conductors, two not directly neighboring strip conductors that are each laminated, printed, or coated onto the carrier layer of the insulating material, are each connected at their connecting ends using through contacts.

The 90° hybrid may have a size of less than approximately 10 cm×10 cm×15 cm for an operating frequency of less than approximately 100 MHz and an output power of approximately 10 to 50 kW.

The 90° hybrid may have a size of less than approximately 10 cm×10 cm×15 cm for an operating frequency between approximately 1 to 100 MHz and an output power of approximately 10 to 50 kW.

The 90° hybrid may have a size of less than approximately 10 cm×10 cm×15 cm for an operating frequency of 13.56 MHz and an output power of approximately 10 to 50 kW.

In another general aspect, a 90° hybrid includes at least one first and at least one second electric conductor that are spaced apart from each other and are capacitively and inductively coupled to each other in a coupling region, and at least one inductance increasing element provided in the coupling region to increase the inductance of the conductors.

Implementations may include one or more of the following features. For example, the at least one inductance increasing element may at least partially surround the conductors in the coupling region. The at least one inductance increasing element may be ring-shaped. The at least one inductance increasing element may include at least one adjustable gap. The at least one inductance increasing element may be formed from ferritic material. The inductance increasing element may be formed as ferrite ring core. The inductance increasing element may include a cooling body, may be connected to a cooling body, or may itself be formed as cooling body.

The length of the at least one first and/or at least one second conductor may be $<\lambda/4$, $<\lambda/8$, or $<\lambda/10$, where $\lambda$ is the wavelength of the signal through the at least one first and at least one second electric conductor.

The conductors may extend parallel to each other. The conductors may be disposed in parallel planes.

The 90° hybrid may include at least one spacer that keeps the at least one first and the at least one second conductor at a predetermined separation from each other. The spacer may be designed as electric insulator. The spacer may be flat, a first conductor may be mounted to one side of the spacer, and a second conductor may be mounted to the opposite side of the spacer. The first and second conductors may be printed, coated, or laminated onto the spacer. The conductors may be implemented as strip conductors.

The at least one first and at least one second electric conductor may include a plurality of first and a plurality of second electric conductors. The first ends of the first conductors and the second ends of the first conductors may be connected to each other in an electrically conducting manner, forming a gate connection at each of the connected ends. The first ends of the second conductors and the second ends of the second conductors may be connected to each other in an electrically conducting manner, forming a gate connection at each of the connected ends. The first and second conductors may be disposed in a conductor stack, in which the first and second conductors are alternately disposed on top of each other. The first and second conductors that are connected at their ends may include laterally offset connecting tags, and neighboring first and second conductors may include mutually offset connecting tags on the same side.

The 90° hybrid may include spacers that are formed as electric insulators and are provided between neighboring conductors. The spacers may include a projection that projects beyond an outline of the conductor.

The 90° hybrid may include several spacers. Conductors may be provided on both sides of a spacer to form a combination structure. The combination structures may be stacked, and the conductors on opposite sides of neighboring spacers may substantially coincide and contact each other.

In another general aspect, a method of providing RF power for plasma or laser excitation processes includes interconnecting output powers of at least two RF generators to a 90° hybrid. Strip conductors are arranged within the 90° hybrid approximately parallel to each other such that the strip conductors form electric capacitive and magnetic inductive couplings for the 90° hybrid. The strip conductors of the 90° hybrid are surrounded with a ferrite ring to increase the inductive coupling.

Implementations may include one or more of the following features. For example, interconnecting output powers of the at least two RF generators may include interconnecting output powers of at least two transistorized power amplifiers.

DETAILED DESCRIPTION

Figure 1:
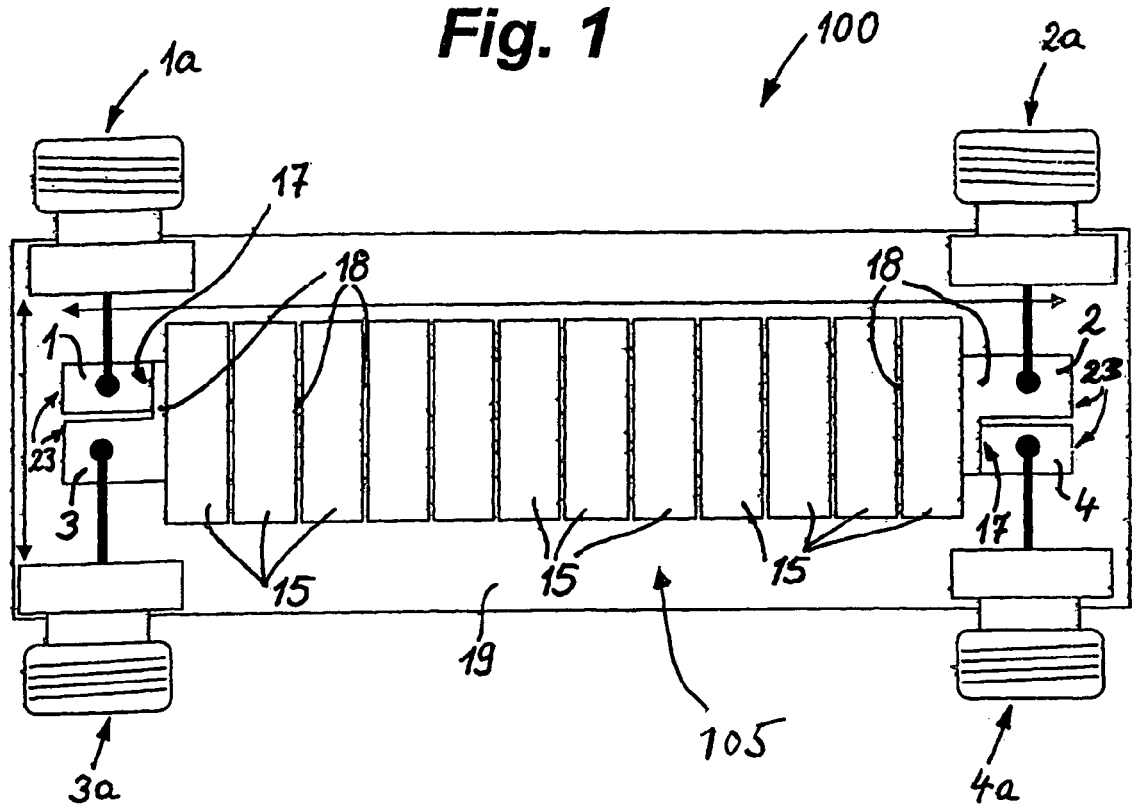
FIG. 1 shows a top view of an implementation of a 90° hybrid.
Figure 4:
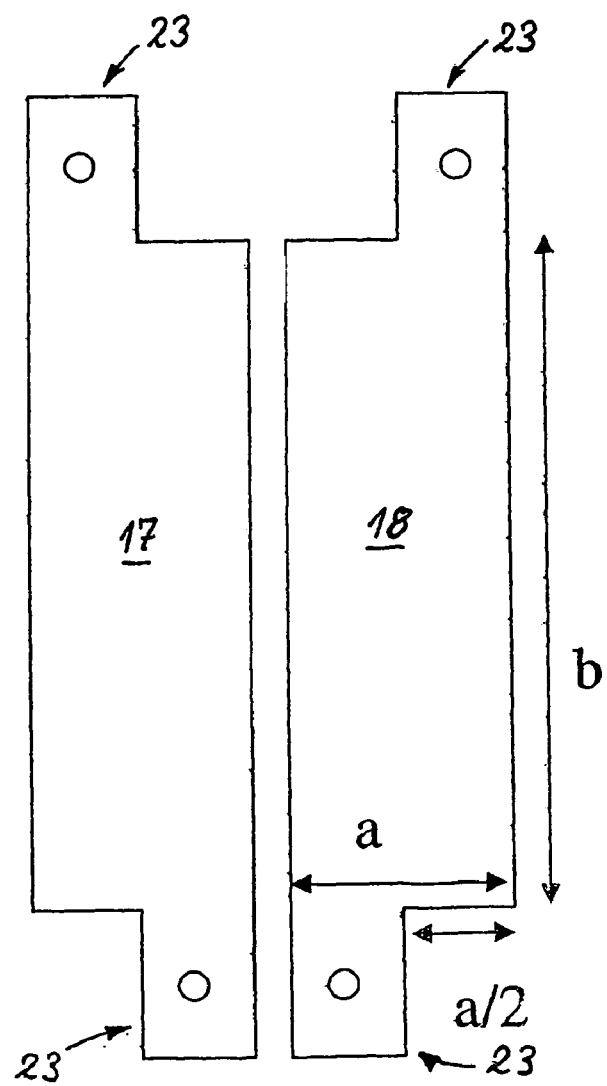
FIG. 4 shows a top view of two strip conductors provided for a 90° hybrid, in a disassembled state.

FIG. 1 shows an implementation of a 90° hybrid 100 forming a quadruple gate or a four-port device with four ports or gate connections. The 90° hybrid 100 includes an arrangement with two parallel strip conductors 17, 18 having a plate-like shape (as shown in FIG. 4) and being coupled in a coupling region 105. The sizes of the strip conductors 17, 18 and their mutual separations are dimensioned to form the electric capacitive and magnetic inductive couplings required for the 90° hybrid 100. The electric capacitive coupling and the magnetic inductive coupling are thereby integrated into one single arrangement of parallel-coupled, planar strip conductors. Ends 23 of the strip conductors 17, 18 form the four connections or ports 1 through 4 of the quadruple gate and are connected to coaxial bushes 1a to 4a.

The 90° hybrid 100 includes an inductance-increasing element such as ferrite ring cores 15 that serve to increase the inductance of the strip conductors 17, 18. The 90° hybrid 100 is built on a base plate 19 that is connected to ground. The inductance-increasing element may have any shape. For example, the cores 15 surround at least part of the strip conductors in the coupling region like a ring, for example, an enclosed geometry that may be circular, ellipsoidal, rectangular etc.

Figure 3:
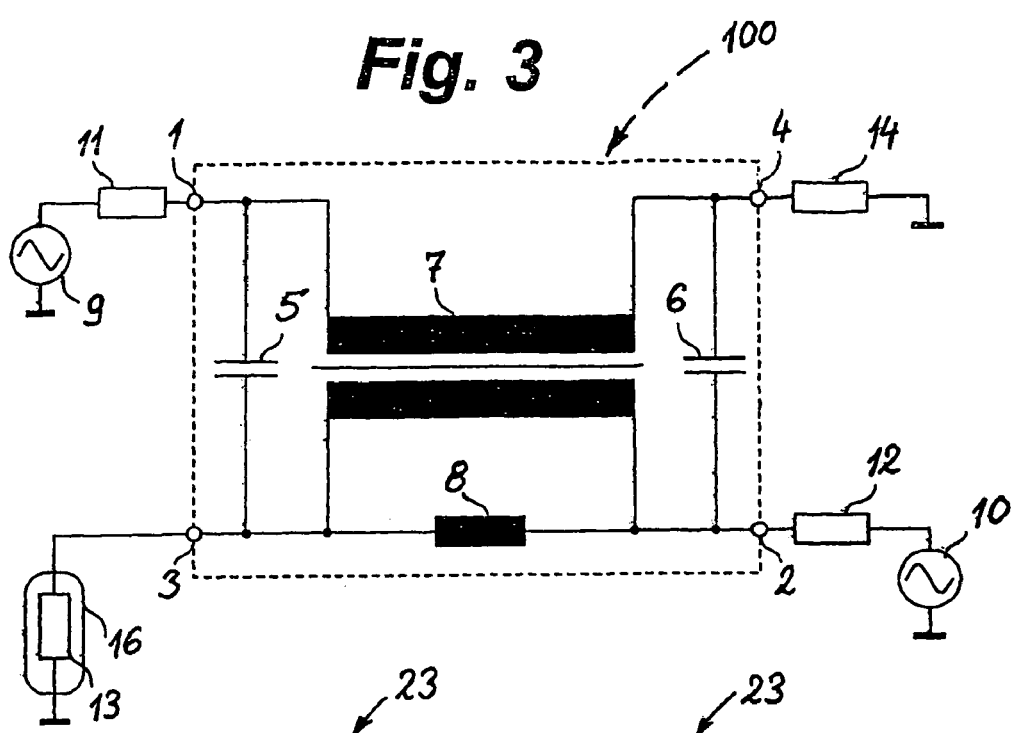
FIG. 3 shows a wiring diagram of a 90° hybrid.

Referring to FIG. 3, the 90° hybrid 100 includes a first connection 1 to a first radio-frequency amplifier 9 having an internal resistance 11, a second connection 2 to a second radio-frequency amplifier 10 having an internal resistance 12, a third connection 3 to a load 16 having a load resistance 13, and a fourth connection 4 to a load compensating resistance 14.

The inductive coupling or the coupling inductance is represented by an inductive transmitter 7, one coupling inductance of which is connected to the first connection 1 and also to the fourth connection 4, and whose other coupling inductance is connected in parallel to an inductance 8, to the third connection 3 and also to the second connection 2. The coupling capacitances are represented by capacitors 5, 6, which are each provided between, respectively, the first and third, and fourth and second connection.

The inductance 8 is substantially determined by the length of the strip conductor between the third connection 3 for the load 16 and the second connection 2 for the second radio-frequency amplifier 10. The magnetic inductive coupling having a ratio 1:1 is substantially determined by the separation between the strip conductors 17, 18 with neighboring flat sides. The coupling capacitances 5, 6 are substantially determined by the surface of the opposite strip conductors 17, 18 and their mutual separations.

Production of a transmitter 7 of this type requires tight inductive coupling, i.e., the primary and secondary strip conductors 17, 18 should be as close to each other as possible. A defined and mainly constant separation between the strip conductors 17, 18 can be realized, in particular, using a board draft and printed circuit board production.

Figure 5:
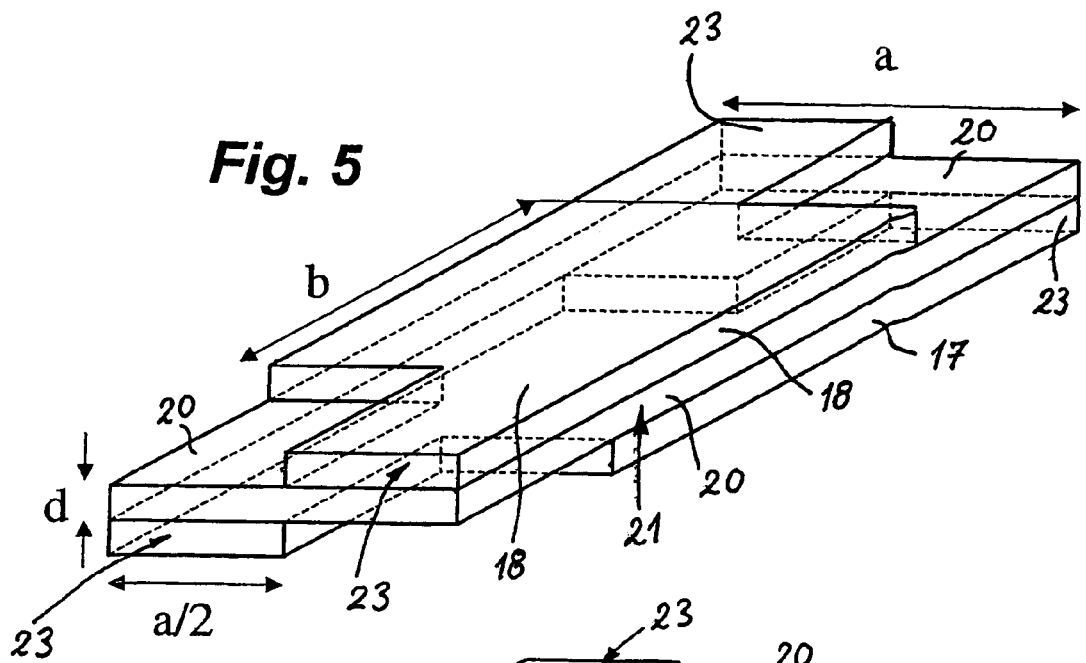
FIG. 5 shows a perspective view of an arrangement of two strip conductors provided for a 90° hybrid in the operative position, with intermediate insulator.

Referring to FIG. 5, since realization of a 90° hybrid requires not only high inductive coupling but also defined electric coupling, the strip conductors 17, 18 are not disposed next to each other but are disposed on top of each other on their flat sides, and are preferably disposed on a board 21 that acts as an insulator 20. Two neighboring surfaces of different potentials thereby conventionally generate a plate capacitor.

The layout of a coupling line is principally designed to create two surfaces each that face one another with surface a*b at a distance d (see FIG. 5). One obtains a transmitter 7 having a ratio 1:1 as well as a certain coupling capacitance. The capacitance is calculated with rough approximation analog to a plate capacitor according to the formula: $C=\epsilon_0 * \epsilon_r * a * b / d$, where a is the width and b is the length of the coupling lines (that is, the strip conductors 17, 18) and d is the distance between the two coupling lines. $\epsilon_0$ is the dielectric constant, and $\epsilon_r$ is the relative dielectric constant of the material of the board 21 that is disposed between the strip conductors 17, 18 as an insulator 20 and a spacer. Since the coupling line passes through the ferrite cores 15, the width of the coupling line was limited to a=18 mm. The length of the coupling line was also minimized.

Figure 2:
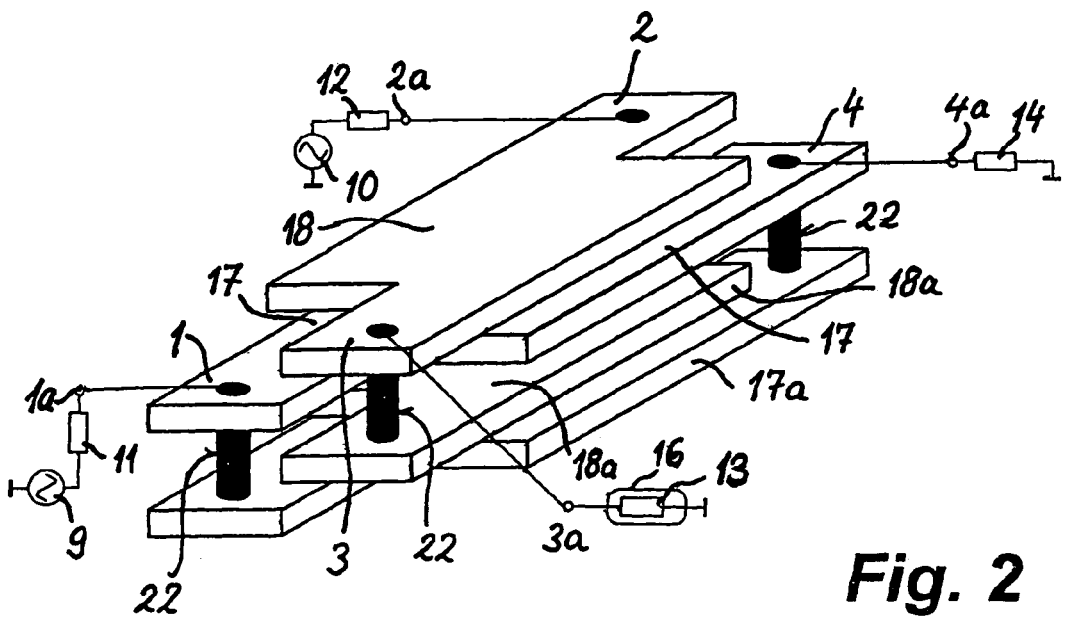
FIG. 2 shows a schematic perspective view of a 90° hybrid with a strip conductor packet formed from four strip conductors.
Figure 7:
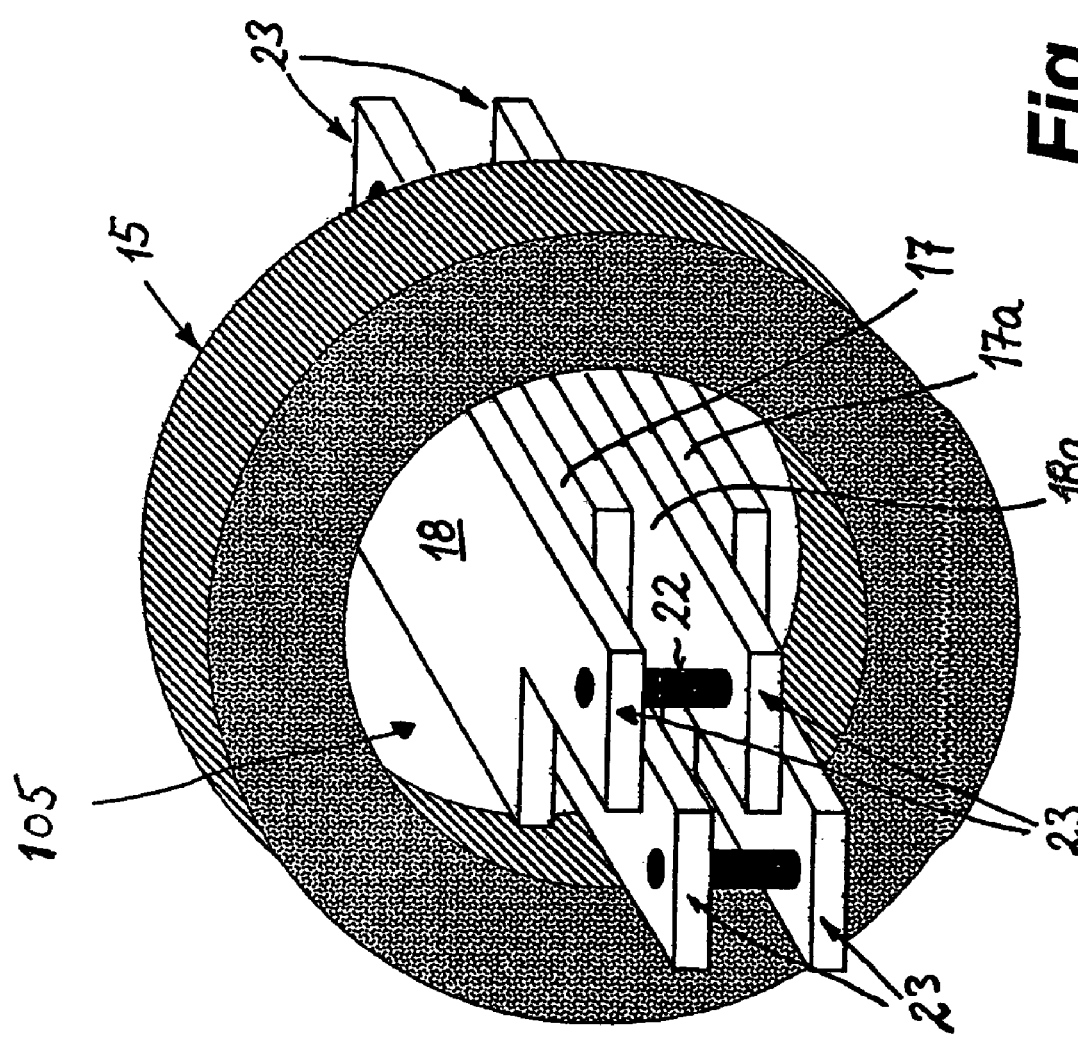
FIG. 7 shows a schematic perspective view of a 90° hybrid with a strip conductor packet and an ring core of ferrite to increase the inductance.

The conductors or the strip conductors 17, 18 may, in principle, be insulated by air, i.e., may be separated by a gap, as is shown in FIGS. 2 and 7. An intermediate spacer, e.g., a solid body insulator (such as the board 21) produces, however, a higher electric strength and a higher capacitance. Moreover, the separation between the strip conductors 17, 18 is defined and mainly constant by the use of the board 21, as mentioned above.

To take into consideration by approximation the edge leakage, a is replaced by a+d/2 and b by b+d/2.

To realize a capacitance of high quality, the board 21 is a dielectric material and is a radio-frequency-compatible, low-loss material (e.g., RT-Duroid 5870 from the company Rogers) preferably having a relative dielectric constant $\epsilon_r=2.33$ and a thickness of d=0.5 mm.

Precise production of the capacitances with a minimum tolerance requires a material of the board 21 that firstly generates reduced or minimum dielectric loss and secondly has an $\epsilon_r$ that is possibly exactly determined. Materials are available having a dielectric constant $\epsilon_r$ of 2.33 with a tolerance of ±0.02 that have proven to be useful in practical tests.

Figure 6:
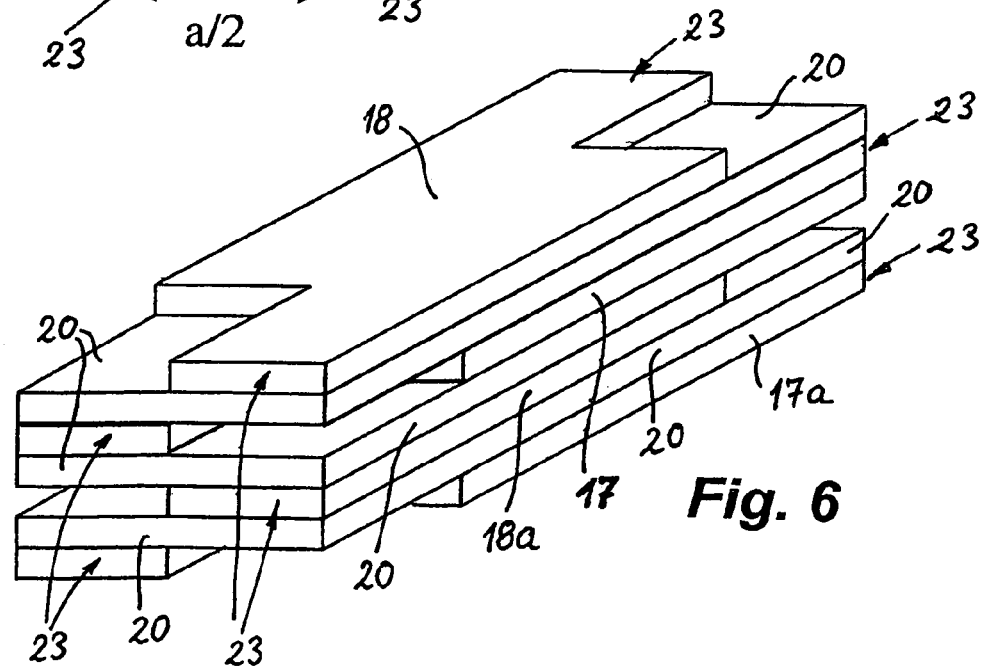
FIG. 6 shows a perspective view of an arrangement of four strip conductors provided for a 90° hybrid in the operative position, with intermediate insulators.

To increase the coupling capacitances with given basic surface, more than two strip conductors 17, 18, i.e., an integer multiple of the two strip conductors, may be disposed with their flat sides facing each other, as is shown in FIGS. 2, 6, and 7. The capacitance increases with each layer by $C=\epsilon_0 * \epsilon_r * a * b / d1$. The capacitance can be preset with the width a of the strip conductors 17, 18. Matching, also for compensation, is possible if required using concentric components that have only low values compared to the overall capacitance, e.g., 1/10 to 1/100 of the overall capacitance.

The implementations shown in FIGS. 2, 6, and 7 show a strip conductor packet consisting of four strip conductors 17, 18 and 17a, 18a, of which two strip conductors 17, 17a or 18, 18a each of which are not directly bordering, are electrically connected at their ends, and form gate connections 1 through 4 at the respectively connected ends. The electric connections 22 can be formed by wire bridges, as is shown in FIGS. 2 and 7, or by through-contacts when boards are used.

The technical realization of the strip conductor arrangement of FIG. 6 can be improved. When an insulating material 20 or a spacer is disposed between the conductors 17, 18, 17a, 18a, as is shown in FIG. 6, the capacitance tolerance is difficult to control due to mounting tolerances, when the strip conductors are not stably supported on the insulating material 20 and, for example, an additional air gap is formed.

To enable sufficient control of the capacitance tolerance, the strip conductors 17, 18, 17a, 18a may be fixed to the insulating material 20 or the spacer, as is known from board production in electronics (for example, copper lamination).

The coupling capacitance is thereby determined by the thickness of the spacer or the insulation material 20 and not by the mounting tolerances.

The strip conductors 17, 18, 17a, 18a can, in principle, be mounted to form a multilayer board, as is shown in FIG. 6. A special low-loss insulating material 20, however, is typically not used in connection with multilayer technology because of additional expense. For this reason, the strip conductors 17, 18 may be mounted on the upper and lower sides of the insulating material 20, as is shown in FIG. 5.

The insulating material 20 may protrude on all four sides to prevent arcing in case of high voltages (not shown in FIG. 5).

A second board 21 may be produced to increase the capacitance. The second board 21 has the same dimensions as the board 21 of FIG. 5 with the only difference that the recesses of the strip conductors 17, 18, 17a, 18a are mounted in a mirror-inverted manner. If a board of this type is disposed directly onto the first board 21, the contacting strip conductor surfaces coincide. The coinciding contacting strip conductors are at the same potential. To obtain the required coupling capacitance, several boards of this type are disposed on top of each other, wherein all even boards are mirror-inverted relative to the uneven boards. The coupling capacitance is generated only within the boards between the insulating material and is not influenced by the mounting tolerances of the plates disposed on top of each other.

In terms of electricity, the same relationship is obtained as in FIG. 6. In mechanical terms, the inner strip conductors 17, 18, 17a, 18a are each present in pairs.

Annular ferrite cores 15 surrounding the strip conductors 17, 18, 17a, 18a are provided (as shown in FIGS. 1 and 7) to increase the inductance.

Tests have shown that a construction of a 90° hybrid having 12 cores 15 and having dimensions of approximately 7×20 cm can couple powers that generate up to 7 kW at the output. With further optimization, powers of up to 10 kW are possible.

Due to its length, each conductor 17, 18, 17a, 18a has its own inductance, which is approximately 7 nH/cm. In order to be able to shorten the length of the strip conductors 17, 18, 17a, 18a resulting from the inductance calculated for the 90° hybrid 100, the ferrite ring cores 15 may be pushed over the coupling strip conductors to obtain the required inductance for a predeterminable strip conductor length, which is approximately 590 nH in the present implementation.

Ferrite core producers (such as Ferroxcube, of the Yageo Corporation, Taiwan) state the $A_L$ value for calculating the increase in inductance by the ferrite ring: $L=A_L*n^2$ (where L=inductance with ferrite, and n=number of windings). In the present case, n=1.

A ring core produced by Ferroxcube having the dimensions 36×23×15 mm (dA×dI×b) has an $A_L$ value of 170 nH according to the producer. Thus, three ring cores can generate an inductance of 510 nH.

It is possible to obtain an $A_L$ value of approximately 44.5 nH with an ring core 15 from Fair-Rite Products Corp. of Wallkill, N.Y. 12589 (using material 67, which is a high frequency NiZn ferrite) and comparable dimensions (35.55× 23×12.7 mm). 11 or 12 cores of this construction type may be used to obtain an inductance of 590 nH.

Excessive or insufficient inductances can be compensated for by capacitances.

For clarity, FIG. 7 shows only one ferrite ring core 15. To considerably reduce the construction length of the 90° hybrid 100, a series of such ferrite ring cores 15 may be provided, e.g., 12 ferrite ring cores 15, as shown in FIG. 1.

Figure 8:
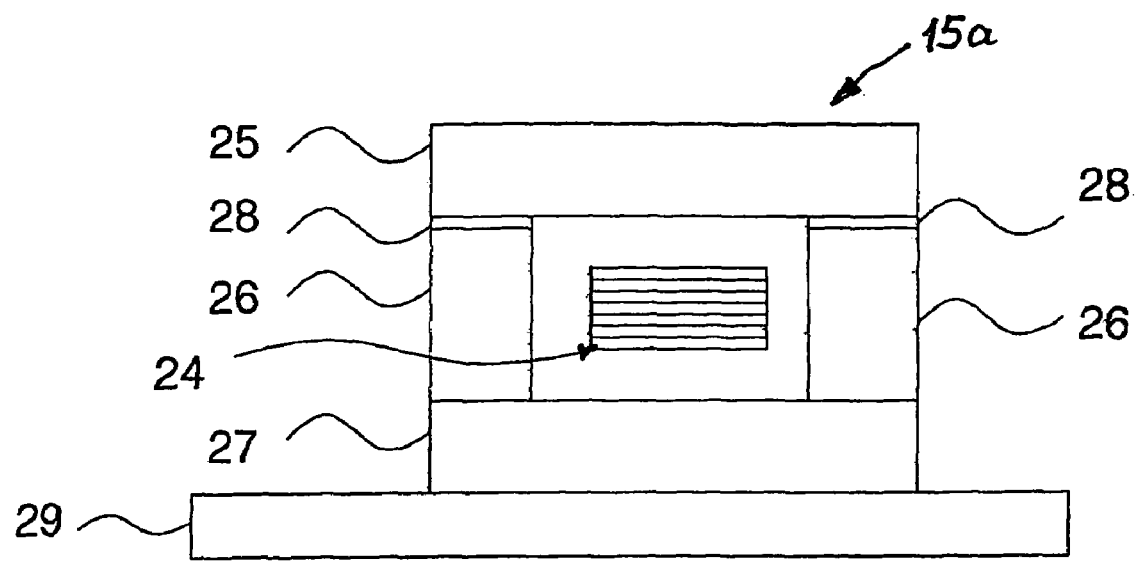
FIG. 8 shows a side view of a ferrite ring core having a rectangular outline, with a strip conductor packet.

The arrangement of FIG. 7 may be further modified by using a ferrite ring core 15a having a rectangular contour according to FIG. 8 instead of the round ferrite ring core 15. The ferrite body with rectangular contour is mounted onto a cooling plate 29, the ferrite body consisting of the parts 27, 26 arranged in the shape of a U, and a transverse leg 25 connecting the free U-shaped leg ends of the parts 26. Parts 25 through 27 have a square or rectangular cross-section or have at least flat outer sides. The strip conductor packet 24 is mounted in a rectangular recess in the center of the ferrite body. To match the inductances, a gap 28 may be provided between the free U-shaped leg ends of the parts 26 and the transverse leg 25, whose thickness can be adjusted with high precision using a foil as is known in the art. This arrangement has the following advantages. The construction of the ring core 15a may be more compact. The heat from the ferrite body can be discharged more effectively to the cooling plate 29 due to flat abutment of the ferrite body on the cooling plate 29. The inductance can be adjusted by varying the air gap 28.

There is also the possibility to design the induction-increasing element, in this implementation the ferrite body itself, as a cooling body. To this end, at least the outer contour of the induction-increasing element may be designed to have a larger surface by providing a profiling, in particular, ribs that are integrally connected to the remaining body. This design may also be provided in combination with additional cooling measures.

The induction-increasing element may include a cooling body, i.e., it may have an integrated cooling body. Any arrangement is feasible.

In order to provide secure mounting of the radio-frequency connections (gates 1 through 4), the strip conductors 17, 18, 17a, 18a may be laterally offset and extended at their ends 23 on approximately half the strip conductor width a/2 to form connecting tags. When printed conductor boards are used, the individual strip conductors 17, 18, 17a, 18a can be connected using simple through-contacts, as are known from printed circuit board technology, and guided to the connections 1a through 4a.

Several advantages can be obtained. For example, precise adjustment of the capacitance with small stray field is possible. The 90° hybrid 100 can be made with a compact design. Maladjustments can be easily determined through current and voltage measurements at the load compensating resistance 14. If there are excessive levels at the load compensating resistance 14, a control means can reduce or switch off the RF amplifiers to protect them. The 90° hybrid 100 can be fashioned to exhibit low stray inductance.

What is claimed is:

1. A 90° hybrid for splitting or interconnecting radio frequency power, the 90° hybrid comprising a quadruple gate including four gate connections, with
capacitances and inductances for electric capacitive coupling and magnetic inductive coupling, wherein electric and magnetic coupling is provided by
an arrangement of strip conductors disposed approximately parallel to each other and whose ends form the gate connections, and whose dimensions and mutual separations are dimensioned to form the electric capacitive and magnetic inductive couplings of the 90° hybrid, the hybrid further comprising a ferrite ring surrounding the strip conductors and configured to increase the inductive coupling.

2. The 90° hybrid of claim 1, wherein the core of the ferrite ring has an $A_L$ value of between approximately 40 nH and 200 nH.

3. The 90° hybrid of claim 1, wherein the arrangement of strip conductors includes more than two of the strip conductors, which are disposed with their flat sides facing each other, to increase the coupling capacitances.

4. The 90° hybrid of claim 1, wherein the arrangement of strip conductors includes a strip conductor packet that is formed of at least four strip conductors, wherein the ends of two not directly neighboring strip conductors are in each case electrically connected, forming gate connections at the respectively connected ends.

5. The 90° hybrid of claim 4, wherein the strip conductors that are connected at their ends have laterally offset connecting tags at their connecting ends, and directly neighboring strip conductors have connecting tags on the same sides that are laterally offset in opposite directions.

6. The 90° hybrid of claim 1, wherein the arrangement of strip conductors includes flat insulators provided between neighboring strip conductors.

7. The 90° hybrid of claim 6, wherein the flat insulators located between the neighboring strip conductors project past the strip conductor outline by preferably approximately 0.5 mm to approximately 3 mm.

8. The 90° hybrid of claim 6, wherein the flat insulators are made of an insulating material having an $\in_r$ of approximately 2 to 2.6, and a thickness of approximately 0.5 mm to 3 mm.

9. The 90° hybrid of claim 1, wherein the arrangement of strip conductors includes a combination structure including an insulating material and a lamination, printing, or coating of each of the strip conductors onto a carrier layer of the insulating material.

10. The 90° hybrid of claim 9, wherein the arrangement of strip conductors includes several combination structures stacked on top of each other.

11. The 90° hybrid of claim 9, wherein the combination structure includes a strip conductor packet having more than two strip conductors, two not directly neighboring strip conductors that are each laminated, printed, or coated onto the carrier layer of the insulating material, are each connected at their connecting ends using through contacts.

12. The 90° hybrid of claim 1, wherein the 90° hybrid has a size of less than approximately 10 cm×10 cm×15 cm for an operating frequency of less than approximately 100 MHz and an output power of approximately 10 to 50 kW.

13. The 90° hybrid of claim 1, wherein the 90° hybrid has a size of less than approximately 10 cm×10 cm×15 cm for an operating frequency between approximately 1 to 100 MHz and an output power of approximately 10 to 50 kW.

14. The 90° hybrid of claim 1, wherein the 90° hybrid has a size of less than approximately 10 cm×10 cm×15 cm for an operating frequency of 13.56 MHz and an output power of approximately 10 to 50 kW.

15. A 90° hybrid comprising:
at least one first and at least one second electric conductor that are spaced apart from each other and are capacitively and inductively coupled to each other in a coupling region, and
at least one inductance-increasing element provided in the coupling region to increase the inductance of the conductors.

16. The 90° hybrid of claim 15, wherein the at least one inductance increasing element at least partially surrounds the conductors in the coupling region.

17. The 90° hybrid of claim 15, wherein the at least one inductance increasing element is ring-shaped.

18. The 90° hybrid of claim 15, wherein the at least one inductance increasing element comprises at least one adjustable gap.

19. The 90° hybrid of claim 15, wherein the at least one inductance increasing element is formed from ferritic material.

20. The 90° hybrid of claim 19, wherein the inductance increasing element is formed as ferrite ring core.

21. The 90° hybrid of claim 15, wherein the inductance increasing element comprises a cooling body, is connected to a cooling body, or is itself formed as cooling body.

22. The 90° hybrid of claim 15, wherein the length of the at least one first and/or at least one second conductor is $<\lambda/4$, where $\lambda$ is the wavelength of the signal through the at least one first and at least one second electric conductor.

23. The 90° hybrid of claim 15, wherein the length of the at least one first and/or at least one second conductor is $<\lambda/8$, where $\lambda$ is the wavelength of the signal through the at least one first and at least one second electric conductor.

24. The 90° hybrid of claim 15, wherein the length of the at least one first and/or at least one second conductor is $<\lambda/10$, where $\lambda$ is the wavelength of the signal through the at least one first and at least one second electric conductor.

25. The 90° hybrid of claim 15, wherein the conductors extend parallel to each other.

26. The 90° hybrid of claim 15, wherein the conductors are disposed in parallel planes.

27. The 90° hybrid of claim 15, further comprising at least one spacer that keeps the at least one first and the at least one second conductor at a predetermined separation from each other.

28. The 90° hybrid of claim 27, wherein the spacer is designed as electric insulator.

29. The 90° hybrid of claim 27, wherein:
the spacer is flat,
a first conductor is mounted to one side of the spacer, and
a second conductor is mounted to the opposite side of the spacer.

30. The 90° hybrid of claim 28, wherein the first and second conductors are printed, coated, or laminated onto the spacer.

31. The 90° hybrid of claim 15, wherein the conductors are implemented as strip conductors.

32. The 90° hybrid of claim 15, wherein:
the at least one first and at least one second electric conductor include a plurality of first and a plurality of second electric conductors,
the first ends of the first conductors and the second ends of the first conductors are connected to each other in an electrically conducting manner, forming a gate connection at each of the connected ends, and
the first ends of the second conductors and the second ends of the second conductors are connected to each other in an electrically conducting manner, forming a gate connection at each of the connected ends.

33. The 90° hybrid of claim 32, wherein the first and second conductors are disposed in a conductor stack, wherein the first and second conductors are alternately disposed on top of each other.

34. The 90° hybrid of claim 32, wherein:
the first and second conductors that are connected at their ends comprise laterally offset connecting tags, and
neighboring first and second conductors include mutually offset connecting tags on the same side.

35. The 90° hybrid of claim 32, further comprising spacers that are formed as electric insulators and are provided between neighboring conductors.

36. The 90° hybrid of claim 35, wherein the spacers include a projection that projects beyond an outline of the conductor.

37. The 90° hybrid of claim 32, further comprising several spacers, wherein:
conductors are provided on both sides of a spacer to form a combination structure,
the combination structures are stacked, and
the conductors on opposite sides of neighboring spacers substantially coincide and contact each other.

38. A method of providing RF power for plasma or laser excitation processes, the method comprising:
interconnecting output powers of at least two RF generators to a 90° hybrid;

arranging strip conductors within the 90° hybrid approximately parallel to each other such that the strip conductors form electric capacitive and magnetic inductive couplings for the 90° hybrid; and surrounding the strip conductors of the 90° hybrid with a ferrite ring to increase the inductive coupling.

39. The method of claim 38, wherein interconnecting output powers of the at least two RF generators includes interconnecting output powers of at least two transistorized power amplifiers.

* * * * *